United States Patent
Schumann et al.

(10) Patent No.: US 6,627,940 B1
(45) Date of Patent: Sep. 30, 2003

(54) MEMORY CELL ARRANGEMENT

(75) Inventors: Dirk Schumann, Dresden (DE);
Bernhard Sell, Dresden (DE); Hans Reisinger, Grünwald (DE); Josef Willer, Riemerling (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/937,838
(22) PCT Filed: Mar. 27, 2000
(86) PCT No.: PCT/DE00/00932
§ 371 (c)(1), (2), (4) Date: Feb. 5, 2002
(87) PCT Pub. No.: WO00/60667
PCT Pub. Date: Oct. 12, 2000

(30) Foreign Application Priority Data

Mar. 30, 1999 (DE) .......................................... 199 14 490

(51) Int. Cl.[7] ....................... H01L 27/108; H01L 29/76; H01L 29/94; H01L 31/119
(52) U.S. Cl. ....................... 257/301; 257/302; 257/303; 257/304; 257/305; 438/595; 438/243; 438/586
(58) Field of Search ....................... 257/301, 302–306, 257/296; 438/243, 253, 238, 239, 259, 535

(56) References Cited

U.S. PATENT DOCUMENTS

| 5,307,310 | A | | 4/1994 | Narita | ....................... 365/149 |
| 5,497,017 | A | | 3/1996 | Gonzales | ..................... 257/306 |
| 5,736,761 | A | | 4/1998 | Risch et al. | ................. 257/301 |
| 6,504,200 | B2 | * | 1/2003 | Schlosser et al. | ........... 257/301 |

FOREIGN PATENT DOCUMENTS

| DE | 199 11 148 | 5/2000 | ......... H01L/27/108 |
| JP | 6-291277 A | 10/1994 | ......... H01L/27/108 |
| WO | 99/60608 | 11/1999 | ........... H01L/21/00 |
| WO | 00/55904 | 9/2000 | ....... H01L/21/8242 |

* cited by examiner

Primary Examiner—D. Le
(74) Attorney, Agent, or Firm—Fish & Richardson P.C.

(57) ABSTRACT

A memory-cell array includes a substrate forming parallel first and second trenches. A transistor's upper source/drain region adjoins two of the first and two of the second trenches, and lies above its lower source/drain region. A conductive structure in a first trench associated with the transistor adjoins the upper source/drain region at its first edge. An insulating structure in the associated first trench insulates the conductive structure from a second edge and from a bottom of the associated first trench. A word line, on which is a further insulating layer, is over the upper/source drain region and parallel to the associated first trench bulges into the second trenches. Insulating spaces adjoin the word line laterally. A contact on the conductive structure and in electrical communication with the upper source/drain region connects with a capacitor.

6 Claims, 5 Drawing Sheets

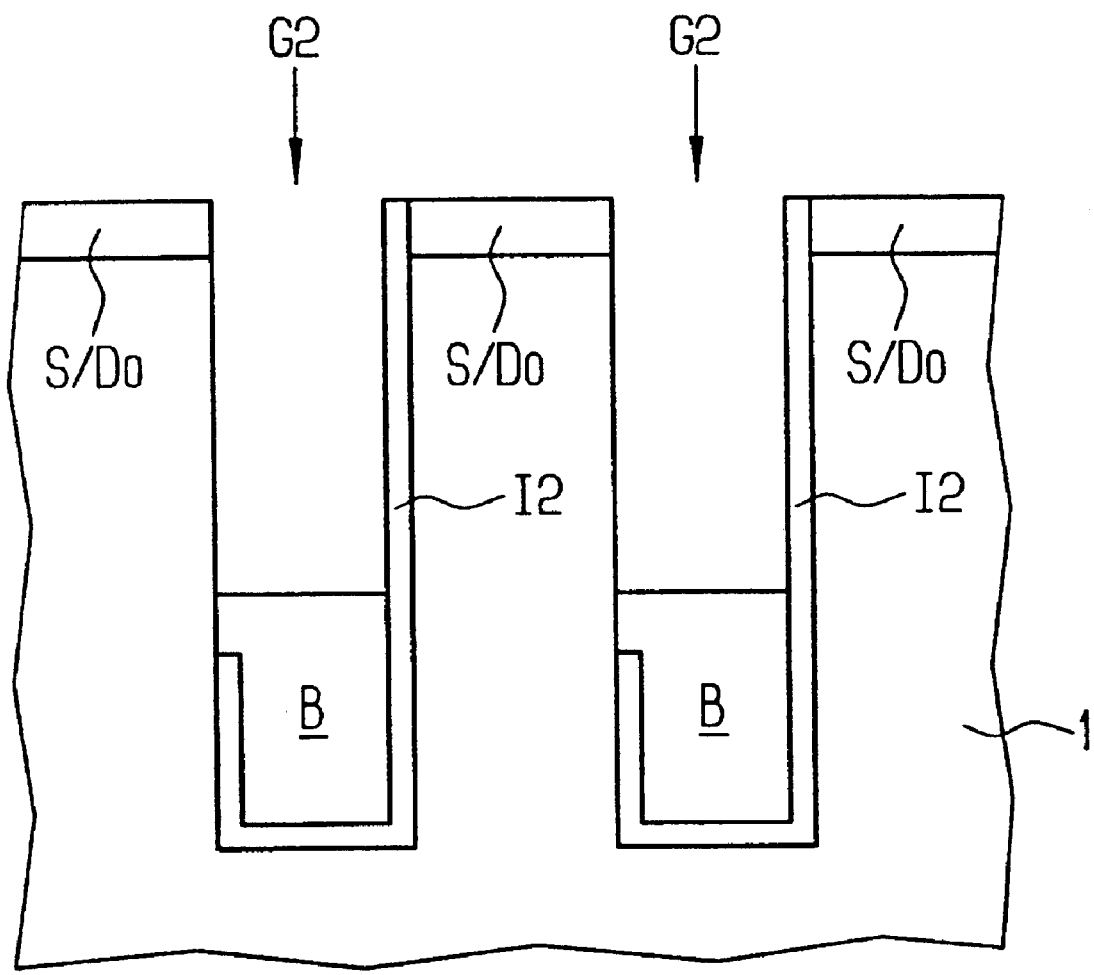

MEMORY CELL ARRANGEMENT

DESCRIPTION

FIELD OF INVENTION

The invention relates to a memory cell array and a method for manufacturing it.

BACKGROUND

At present, what is referred to as a single-transistor memory cell, comprising a transistor and a capacitor, is used almost exclusively as the memory cell of a DRAM cell array, i.e. a memory cell array with dynamic random access. The information of the memory cell is stored in the form of a charge on the capacitor. The capacitor is connected to the transistor in such a way that when the transistor is switched on via a word line, the charge of the capacitor can be read out via a bit line.

The general aim is to produce a DRAM cell array which has a high packing density.

EP 0852396 A2 describes a DRAM cell array which comprises single-transistor memory cells. The transistor of a memory cell is embodied as a vertical transistor and is arranged on an edge of a depression in a substrate. The depression is arranged in a rectangular region which is surrounded by an insulating structure and adjoins the insulating structure with a first edge. An upper source/drain region and a lower source/drain region of the transistor, which are arranged in the substrate, adjoin a second edge of the depression lying opposite the first edge. A memory node of a capacitor of the memory cell which adjoins the lower source/drain region is arranged in a lower part of the depression. A bit line is arranged on the upper source/drain region. An insulated word line, which has downwardly directed bulges which extend into the depressions of the memory cells and act as gate electrodes of the transistors of the memory cells, is arranged over the bit line.

U.S. Pat. No. 4,630,088 describes a DRAM cell array which comprises single-transistor memory cells. The transistor of a memory cell is embodied as a vertical transistor. An upper and a lower source/drain region are parts of a parallelepiped-shaped projection of a substrate and are surrounded in annular fashion by a gate electrode. The upper source/drain region serves simultaneously as a capacitor electrode of a capacitor of the memory cell. A bit line is arranged over the capacitor electrode and serves simultaneously as a further capacitor electrode of the storage capacitor.

SUMMARY

The invention is based on the problem of disclosing a further memory cell array in which a memory cell comprises a transistor and a capacitor. In addition, the intention is to disclose a manufacturing method for such a memory cell array.

The problem is solved by means of a memory cell array in which a memory cell comprises a transistor and a capacitor and has the following features:

First trenches which are parallel to one another and second trenches which run transversely with respect to the first trenches are provided in a substrate. An upper source/drain region of the transistor is arranged in the substrate and adjoins two of the first trenches and two of the second trenches. A lower source/drain region of the transistor is arranged in the substrate, under the upper source/drain region. The transistor is therefore embodied as a vertical transistor. Conductive structures, which each adjoin one of the upper source/drain regions at a first edge of the associated first trench and are insulated from a second edge and from the bottom of the first trench by an insulating structure arranged in the first trench, are arranged in the first trenches between the second trenches. A word line runs parallel to the first trenches and has bulges which extend into the second trenches. Parts of the word line which are arranged between the second trenches are arranged over an insulating layer. The insulating layer is arranged over the upper source/drain region. A further insulating layer is arranged on the word line. Insulating spacers adjoin the word line laterally. The capacitor is connected to the upper source/drain region via a contact which is arranged on the conductive structure and between word lines.

The problem is also solved by means of a method for manufacturing a memory cell array in which first trenches which run essentially parallel to one another are produced in a substrate. The first trenches are filled with insulating material. The insulating material is partially replaced with conductive material in such a way that the conductive material adjoins first edges, and the insulating material adjoins second edges and bottoms, of the first trenches. An insulating layer which covers the conductive material is produced. Second trenches which run essentially parallel to one another and transversely with respect to the first trenches are produced in the substrate in such a way that conductive structures which are separated from one another are produced from the conductive material and insulating structures which are separated from one another are produced from the insulating material. Upper source/drain regions of vertical transistors, and below them lower source/drain regions of the transistors, are produced in the substrate in such a way that the upper source/drain regions each adjoin a surface of the substrate, two of the first trenches and two of the second trenches. Word lines are generated parallel to the first trenches in such a way that they have bulges which extend into the second trenches and in each case partially overlap two of the first trenches. The word lines are insulated by a further insulating layer produced over them, and by spacers. The insulating layer is etched selectively with respect to the further insulating layer and with respect to the spacers in such a way that the conductive structures are exposed. Capacitors are generated which are connected to the conductive structures via contacts.

The conductive structure adjoins the upper source/drain region laterally and is separated from the rest of the substrate by the insulating structure. The conductive structure makes it possible to make contact with the upper source/drain region from above although the word line is arranged over the upper source/drain region. Because the conductive structure and the upper source/drain region overlap over a large area, a contact resistance between the capacitor and the transistor is particularly small.

The memory cell array can be manufactured with a high packing density because the manufacturing method has a large number of self-aligned process steps, i.e. process steps without masks which have to be aligned or process steps with large alignment tolerances. For example, the upper source/drain region and the capacitor can be placed in contact without precise alignment. Because the word line does not cover the conductive structure, it is possible to etch selectively with respect to the further insulating layer and with respect to the insulating spacers so that the contacts themselves are then produced between word lines which are adjacent to one another if the alignment of the contacts with respect to the upper source/drain regions is imprecise. The upper source/drain region can be produced self-aligned with respect to the first trenches and to the second trenches. To do this, it is possible, for example, to implant the substrate after the first and second trenches have been produced. Alternatively, before the first trenches and/or the second trenches are produced, a doped layer is produced in the substrate by implantation, and said doped layer is patterned by the first trenches and the second trenches with the result that the upper source/drain regions are produced from the doped region. The lower source/drain regions can also be produced self-aligned under the upper source/drain regions. For example, the lower source/drain region is part of a buried doped layer of the substrate. The alignment tolerance of the word line is large because all that is necessary is to fulfill the condition that the bulges extend into the second trenches where they can act as gate electrodes of the transistors, and that the upper source/drain region of the adjacent memory cell is not exposed during the selective etching in order to produce the contact of a memory cell.

In order to fulfill the condition just mentioned, a width of the word line is preferably greater than a width of the upper source/drain region. As a result, the alignment tolerance for producing the word line is increased and consequently the process reliablility is improved. In this case, the word line partially overlaps the two first trenches.

The space required for each memory cell of the memory cell array can be $4F^2$, F being the minimum structural size which can be manufactured in the technology used. To do this, the first and second trenches have a width of F. Distances between adjacent first trenches or adjacent second trenches are then also F.

In order to produce a particularly wide word line, it is possible to initially deposit conductive material over the entire area. A strip-shaped word line mask is then produced, the strips of which have a width of F and are at a distance of F from one another. The strips of the word line mask are subsequently widened by depositing material and etching it back so that spacers are produced on side faces of the word line mask. The conductive material can then be structured to form the word lines using the widened word line mask.

The memory cell array can be manufactured in such a way that the word line has a high electrical conductivity because parts of the word line are not buried in the substrate and can consequently be manufactured from metal. In order to produce such a word line, doped polysilicon is firstly deposited and then a metal or a metal silicide. Both materials are then structured with the word line mask. The lower source/drain region can be connected to a bit line which runs transversely with respect to the word line. The bit line is arranged in a lower part of the second trench and adjoins the lower source/drain region at a first edge of the second trench.

In order to avoid floating body effects, the lower source/drain region preferably adjoins only one of the two second trenches and is at a distance from the other of the two second trenches. The lower source/drain region can, for example, be produced by diffusing dopant out of the bit line.

The lower source/drain region can alternatively be produced from the buried doped layer of the substrate which is structured by means of the second trenches.

In order to avoid leakage currents, lower source/drain regions of transistors which are adjacent to one another along the second trench are preferably separated from one another by means of the first trenches.

Alternatively, the first trenches are only of such a depth that they separate the upper source/drain regions of these transistors from one another but not the lower source/drain regions of these transistors.

In order to increase the electrical conductivity of the bit line, the bit line can contain metal. A lower part of the bit line is preferably composed of metal and an upper part of the bit line, which adjoins the lower source/drain region, is preferably composed of polysilicon. A diffusion barrier separates the two parts from one another.

The bit line can be embodied as part of a capacitor electrode. In this case, it runs above the substrate. Lower source/drain regions of transistors which are adjacent to one another along one of the first trenches can be connected to one another in this case. Preferably, the buried doped layer is provided which is not divided by the first trenches and the second trenches.

The conductive structures can, for example, be produced in that a protective layer is initially produced on the substrate before the first trenches are produced. The protective layer is composed, for example, of silicon nitride or of some other material which is preferably insulating. The insulating material is replaced with the conductive material in such a way that, using a strip-shaped mask whose strips run parallel to the first trenches and in each case partially overlap one of the first trenches, the insulating material is etched selectively with respect to the protective layer to a depth which lies above the bottoms of the first trenches and the conductive material is then deposited and etched back until the protective layer is exposed.

The memory cell array can be a DRAM cell array. In order to increase the capacitances of the capacitors, the capacitors have a capacitor dielectric which preferably has a dielectric constant which is more than 20. The capacitor dielectric is composed, for example, of a ferroelectric with a Curie temperature of less an $-50°$ C., for example barium strontium titanate, or of $Ta_2O_5$.

The memory cell array can be a FRAM memory cell array. In this case, the capacitors have a capacitor dielectric which has a ferroelectric with a Curie temperature preferably of more than 200° C.

An exemplary embodiment of the invention is explained below in more detail with reference to the figures, of which:

The figures are not to scale.

DETAILED DESCRIPTION

A substrate 1 made of monocrystalline silicon is provided in the exemplary embodiment.

Thermal oxidation is carried out in order to produce an approximately 10 nm-thick screen oxide (not illustrated).

Figure 1:
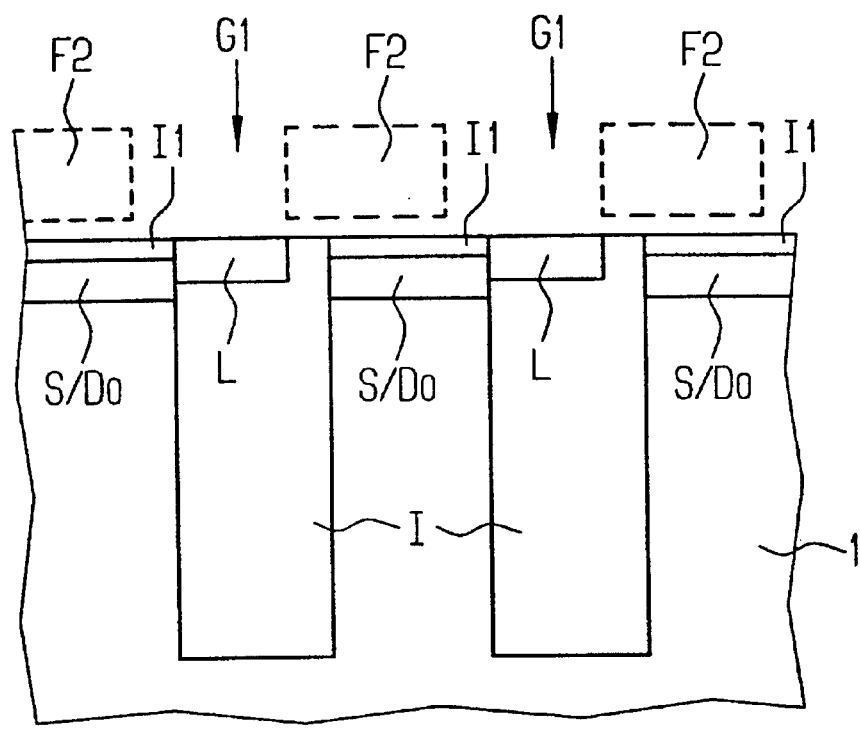
FIG. 1a shows a cross section through a substrate after a protective layer, first trenches, second trenches (illustrated in FIG. 1b), upper source/drain regions, insulating structures and conductive structures have been produced. In addition, the position of a photoresist mask is illustrated schematically.
FIG. 1b shows a cross section which is perpendicular to the cross section in FIG. 1a through the substrate after the process steps from FIG. 1a, FIG. 2 shows the cross section from FIG. 1b after a first part of an insulating layer and bit lines have been produced.
Figure 1:
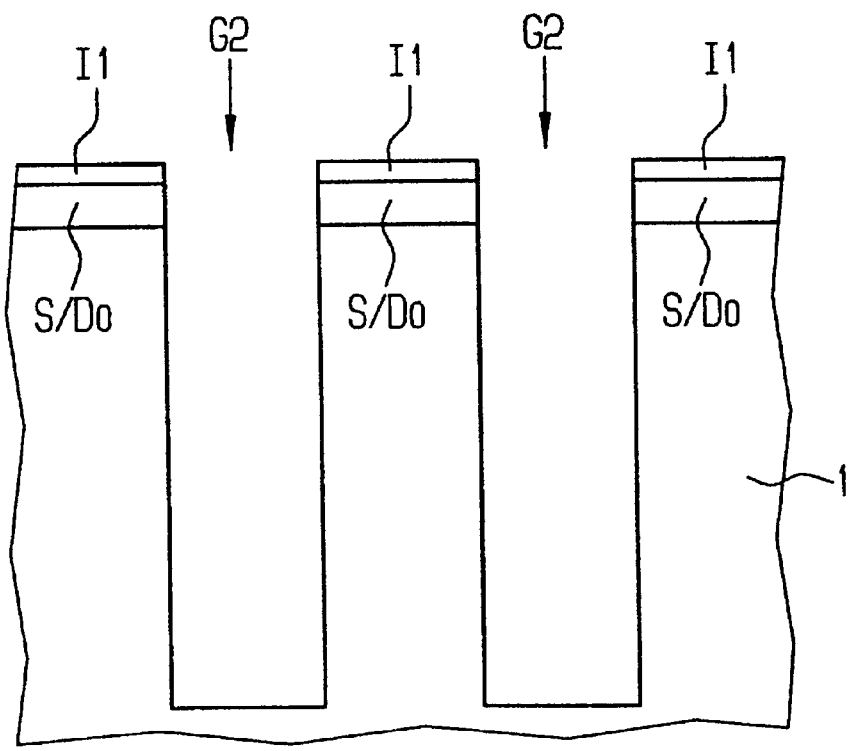

Implantation with an energy level of approximately 10 keV and a dose of approximately $5*10^{14}$ cm$^{-2}$ is carried out over the whole surface using n-doping ions so that a doped layer is produced which adjoins a surface of the substrate 1. A protective layer I1 is then produced by depositing silicon nitride to a thickness of approximately 30 nm (see FIG. 1a and 1b).

Approximately 400 nm-deep first trenches G1 are produced in the substrate 1 using a strip-shaped first photoresist mask (not illustrated). The first trenches G1 are approximately 100 nm wide and are at a distance of approximately 100 nm from one another (see FIG. 1a). $SiO_2$ is then deposited to a thickness of approximately 100 nm and planarized by chemical-mechanical polishing until the protective layer I1 is exposed.

$SiO_2$ is etched to a depth of approximately 50 nm using a second photoresist mask F2 which corresponds to the first photoresist mask but is displaced perpendicularly with respect to the first trenches by approximately 35 nm so that in each case its strips only partially overlap one of the first trenches. The second photoresist mask F2 is removed. The removed $SiO_2$ is replaced with conductive material in that polysilicon doped in situ is deposited to a thickness of approximately 50 nm and planarized by chemical-mechanical polishing until the protective layer I1 is exposed.

Using a strip-shaped third photoresist mask (not illustrated) whose strips run transversely with respect to the first trenches G1, are approximately 100 nm wide and are at a distance of approximately 100 nm from one another, the protective layer I1 is divided and the substrate 1 is etched to approximately 500 nm. This produces second trenches G2 which are deeper than the first trenches G1 (see FIG. 1b). The doped layer is structured by means of the first trenches G1 and the second trenches G2. Remaining parts of the doped layer are suitable as upper source/drain regions S/Do of transistors. $SiO_2$ and the polysilicon are structured in the first trenches G1 by means of the second trenches G2 so that insulating structures I and conductive structures L are produced (see FIG. 1a). Polysilicon and $SiO_2$ are etched with approximately the same etching rate during the production of the second trenches G2.

The third photoresist mask is removed.

$SiO_2$ is deposited to a thickness of approximately 15 nm in order to produce a first part of an insulating layer I2. The $SiO_2$ covers the conductive structures L and edges and bottoms of the second trenches G2.

Polysilicon which is doped in situ is then deposited to a thickness of approximately 50 nm and planarized by chemical-mechanical polishing until the protective layer I1 is exposed. Polysilicon is then etched back to a depth of approximately 400 nm.

Exposed $SiO_2$ is removed by means of, for example, hydrofluoric acid, using a fourth strip-shaped photoresist mask (not illustrated) whose strips do not cover first edges of the second trenches G2. Remaining $SiO_2$ forms the first part of the insulating layer I2 (see FIG. 2).

The fourth photoresist mask is removed.

Further polysilicon doped in situ is then deposited to a thickness of approximately 50 nm and etched back to a depth of approximately 300 nm so that in each case a bit line B is produced in the second trenches G2, said bit line B adjoining the substrate 1 at a second edge of the associated second trench G2 (see FIG. 2).

The protective layer I1 is removed (see FIG. 2).

Thermal oxidation is carried out in order to produce a second part of the insulating layer I2. The insulating layer I2 also covers the bit lines B (see FIG. 3b). The thermal oxidation acts as a heat-treatment step by means of which dopant diffuses out of the bit lines B into the substrate 1 and forms there lower source/drain regions S/Du of the transistors (see FIG. 3b). Each of the lower source/drain regions S/Du adjoins that second trench G2 in which that bit line B is arranged out of which the dopant with which the lower source/drain region has been produced is diffused. The lower source/drain region S/Du is arranged between this second trench G2 and an adjacent second trench G2 and is spaced apart from the adjacent second trench G2.

Polysilicon doped in situ is then deposited to a thickness of approximately 40 nm so that the second trenches G2 are filled. Tungsten silicide is deposited to a thickness of approximately 50 nm over said polysilicon.

Figure 3A:
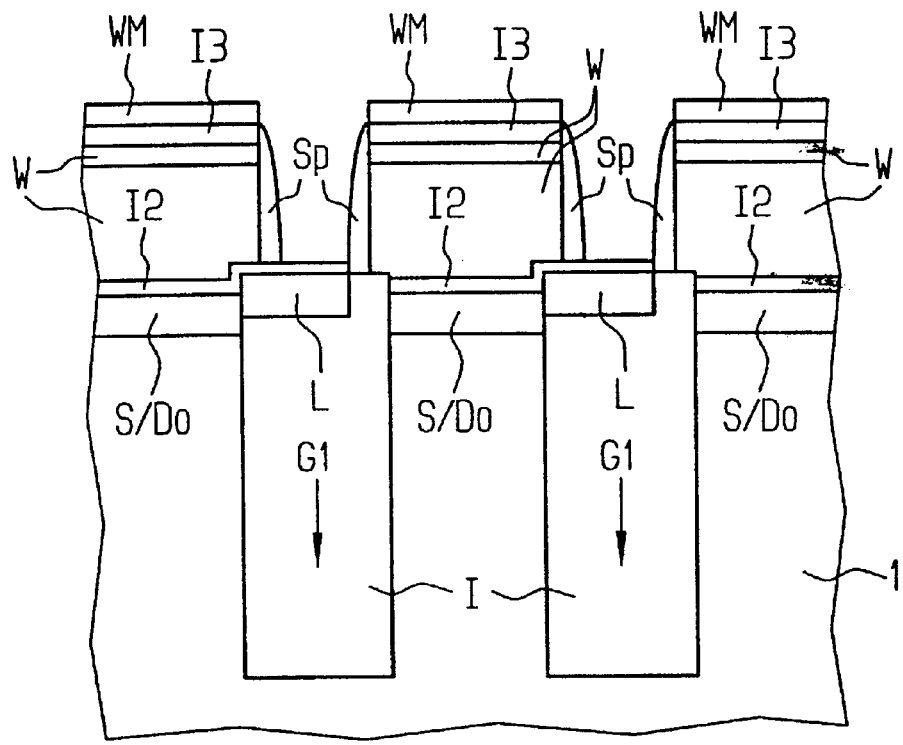
FIG. 3a shows the cross section from FIG. 1a after a second part of the insulating layer, lower source/drain regions, a word line mask, word lines, a second insulating layer and spacers have been produced.
Figure 3B:
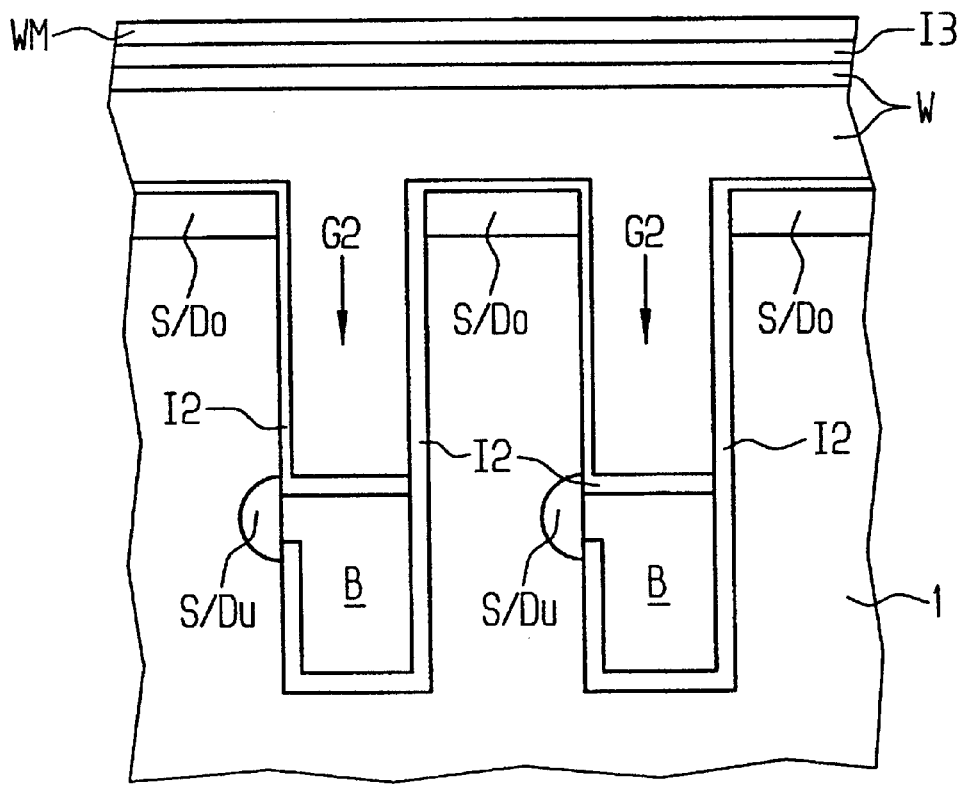
FIG. 3b shows the cross section from FIG. 1b after the process steps from FIG. 3a, FIG. 4 shows the cross section from FIG. 3a after insulation, contacts and memory nodes of capacitors have been produced.

In order to produce a further insulating layer I3, silicon nitride is deposited to a thickness of approximately 50 nm (see FIGS. 3a and 3b).

In order to produce a word line mask WM, $SiO_2$ is applied to a thickness of approximately 50 nm and structured in a strip shape by a photolithographic method so that the strips run parallel to the first trenches G1 and are arranged between the trenches G1. The strips have a width of approximately 100 nm and are at a distance of approximately 100 nm from one another. In order to widen the strips, $SiO_2$ is deposited and etched back. This produces the word line mask whose strips have a width of approximately 140 nm. The strips of the word line mask WM each overlap two first trenches G1 which are adjacent to one another (see FIGS. 3a and 3b).

The further insulating layer I3, tungsten silicide and polysilicon are etched using the word line mask WM until parts of the insulating layer I2 which are arranged on the bit lines B are exposed. Word lines W which run transversely with respect to the bit lines B and have downwardly directed bulges which extend into the second trenches G2 (see FIGS. 3a and 3b) are thus produced from the polysilicon and the tungsten silicide.

In order to reduce leakage currents, a thermal oxidation is carried out in such a way that the insulating layer I2 is thickened in certain sections as far as under the word lines W. The insulating layer I2 is therefore thickened in the vicinity of edges of the word lines W. This thermal oxidation corresponds to what is referred to as the re-oxidation step in planar transistors.

In order to produce insulating spacers Sp, silicon nitride is deposited to a thickness of approximately 10 nm and etched back (see FIG. 3a). The spacers Sp cover lateral faces of the word lines W.

Figure 4:
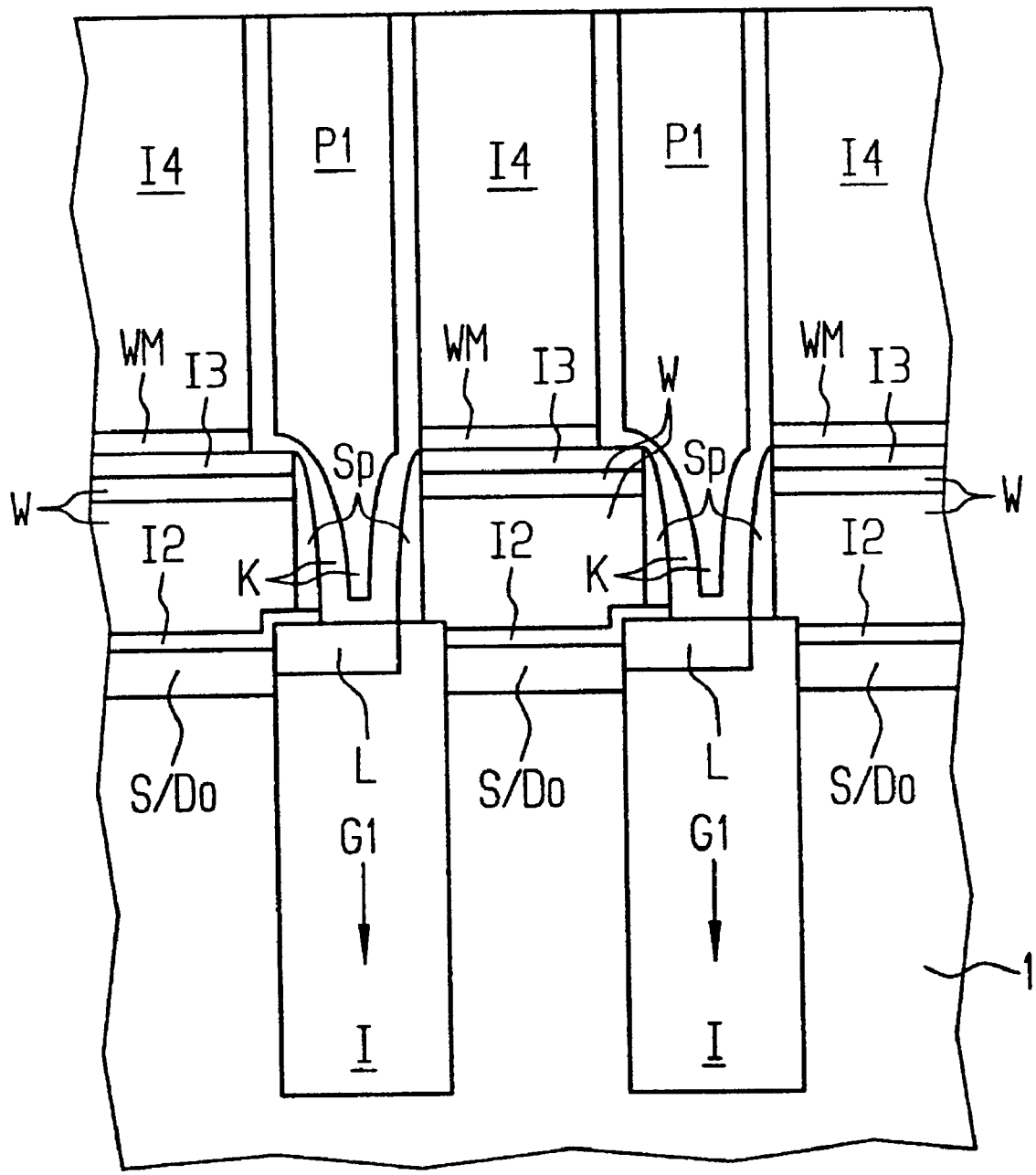

$SiO_2$ is deposited to a thickness of approximately 1000 nm in order to produce insulation I4. Using a fifth photoresist mask (not illustrated), depressions which are separated from one another are produced in such a way that they each expose one of the conductive structures L (see FIG. 4). To do this, $SiO_2$ is etched selectively with respect to silicon nitride. The alignment tolerance of the depressions is large because the further insulating layer I3 and the spacers Sp protect the word lines W.

In order to produce contacts K and storage nodes P1 of capacitors in the depressions, initially titanium and TiN are deposited to a total thickness of approximately 20 nm. Tungsten nitride is then deposited to a thickness of approximately 50 nm so that the depressions are filled. Tungsten nitride, titanium and titanium nitride are eroded by chemical-mechanical polishing until the insulation I4 is exposed. This produces the contacts K between the word lines W in the depressions. The storage nodes P1 are produced from the tungsten nitride by means of the contacts K (see FIG. 4). $SiO_2$ is then etched to an etching depth of approximately 1000 nm using hydrofluoric acid so that parts of the insulation I4 which are arranged over the word lines W, and the word line mask WM, are removed (see FIG. 5). Titanium and titanium nitride on the storage nodes P1 are then removed using $H_2O_2/NH_4OH$, for example.

Figure 5:
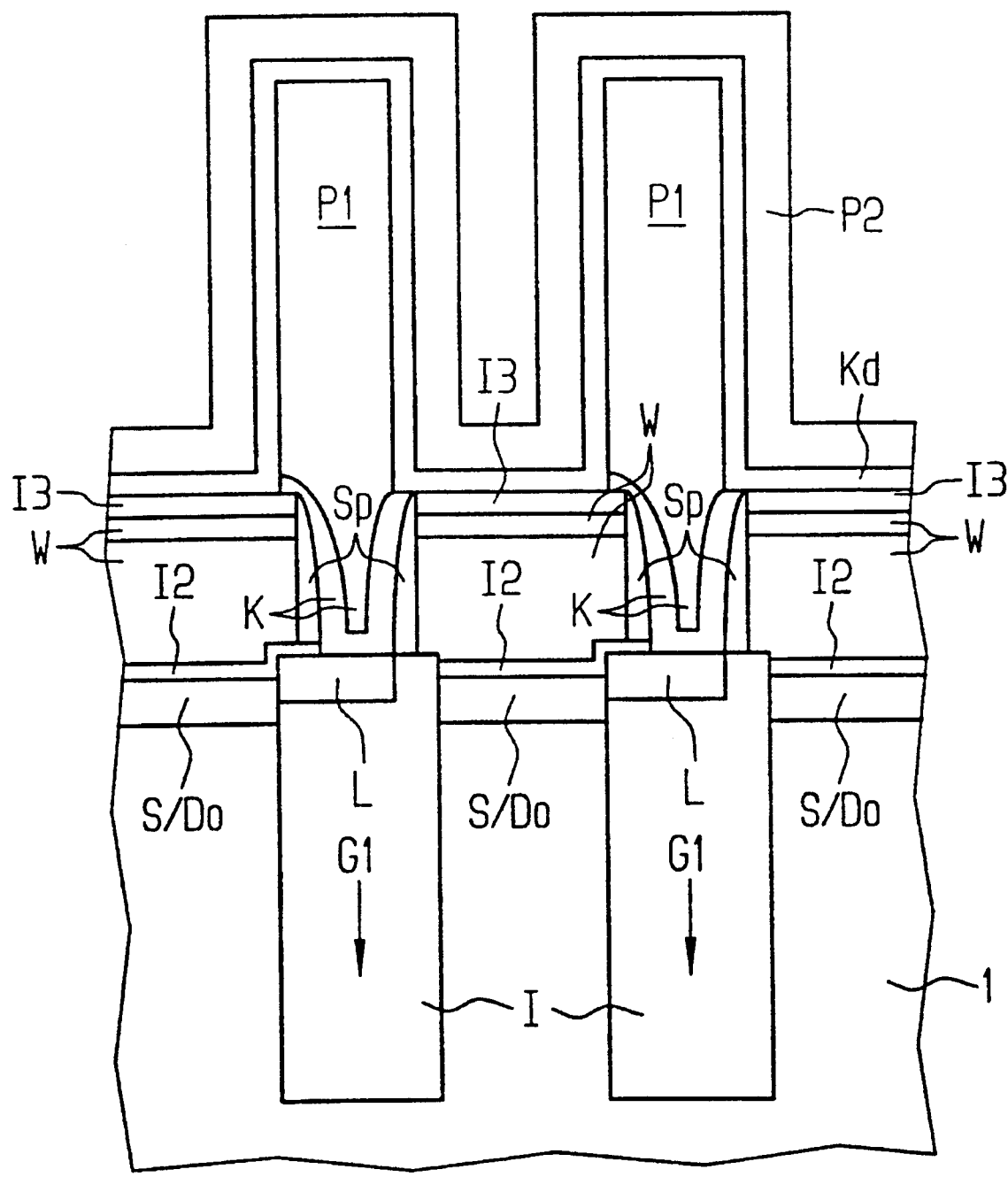
FIG. 5 shows the cross section from FIG. 4 after a capacitor dielectric and a capacitor electrode of the capacitors have been produced.

$Ta_2O_5$ is deposited to a thickness of approximately 10 nm in order to produce a capacitor dielectric Kd of the capacitors (see FIG. 5).

Titanium nitride is deposited to a thickness of approximately 50 nm (see FIG. 5) in order to produce a common capacitor electrode P2 of the capacitors.

The memory cell array which is produced is a DRAM cell array whose memory cells each comprise a transistor and a capacitor. The bulges of the word lines W act as gate electrodes of the transistors.

A large number of variations of the exemplary embodiment which also lie within the scope of the invention are conceivable. For example, the dimensions of the layers, trenches and masks can be adapted to the respective requirements. The same applies to the selection of materials.

What is claimed is:

1. A memory cell array in which a memory cell comprises a transistor and a capacitor, in which first trenches (G1) which are parallel to one another and second trenches (G2) which run transversely with respect to the first trenches (G1) are provided in a substrate (1), in which an upper source/drain region (S/Do) of the transistor is arranged in the substrate (1) and adjoins two of the first trenches (G1) and two of the second trenches (G2), in which a lower source/drain region (S/Du) of the transistor is arranged in the substrate (1), under the upper source/drain region (S/Do), in which conductive structures (L), which each adjoin one of the upper source/drain regions (S/Do) at a first edge of the associated first trench (G1) and are insulated from a second edge and from the bottom of the first trench (G1) by an insulating structure (I) arranged in the first trench (G1), are arranged in the first trenches (G1) between the second trenches (G2), in which a word line (W) runs parallel to the first trenches (G1), has bulges which extend into the second trenches (G2), is arranged between the second trenches (G2) over an insulating layer (I2) and is arranged over the upper source/drain region (S/Do)

in which a further insulating layer (I3) is arranged on the word line (W), and insulating spacers (Sp) adjoin the word line (W) laterally, in which the capacitor is connected to the upper source/drain region (S/Do) via a contact (K) which is arranged on the conductive structure (L) and between word lines (W).

2. The memory cell array as claimed in claim 1, in which the lower source/drain region (S/Du) adjoins a bit line (B) at a first edge of one of the two second trenches (G2), said bit line (B) being arranged in a lower part of the second trench (G2).

3. The memory cell array as claimed in claim 1, in which the first trenches (G1) are of such a depth that they separate from one another the lower source/drain regions (S/Du) of transistors which are adjacent to one another along the second trench (G2).

4. A memory-cell array comprising:

a substrate forming parallel first trenches and second trenches perpendicular to said first trenches;

a transistor having an upper source/drain region adjoining two of said first trenches and two of said second trenches, and a lower source/drain region under said upper source/drain region;

a conductive structure arranged in a first trench associated with said transistor, said conductive structure adjoining said upper source/drain region at a first edge of said associated first trench;

an insulating structure arranged in said associated first trench to insulate said conductive structure from a second edge and from a bottom of said associated first trench;

a word line extending parallel to said associated first trench and having bulges extending into said second trenches, said word line being arranged over said upper/source drain region;

a further insulating layer arranged on said word line;

insulating spaces adjoining said word line laterally; and a contact in electrical communication with said upper source/drain region, said contact being arranged on said conductive structure for connection with a capacitor.

5. The memory-cell array of claim 4, further comprising: a bit line adjoining said lower source/drain region at a first edge of a second trench, said bit line being arranged in a lower part of said second trench.

6. The memory-cell array of claim 4, wherein said substrate forms first trenches having a depth selected to separate from each other said lower source/drain regions.

* * * * *